United States Patent [19]
Baba et al.

[11] Patent Number: 5,705,827
[45] Date of Patent: Jan. 6, 1998

[54] TUNNEL TRANSISTOR AND METHOD OF MANUFACTURING SAME

[75] Inventors: Toshio Baba; Tetsuya Uemura, both of Tokyo, Japan

[73] Assignee: NEC Corporation, Tokyo, Japan

[21] Appl. No.: 303,152

[22] Filed: Sep. 8, 1994

Related U.S. Application Data

[63] Continuation of Ser. No. 992,738, Dec. 18, 1992, abandoned.

[30] Foreign Application Priority Data

Dec. 25, 1991 [JP] Japan .................................. 3-341593
Dec. 25, 1991 [JP] Japan .................................. 3-341594

[51] Int. Cl.⁶ ............................. H01L 29/40; H01L 29/76
[52] U.S. Cl. ................................ 257/46; 257/20; 257/105; 257/194; 257/289; 257/410; 257/411
[58] Field of Search ............................ 257/104, 105, 257/106, 289, 194, 12, 20, 24, 27, 46, 410–411, 472

[56] References Cited

U.S. PATENT DOCUMENTS

| | | | |
|---|---|---|---|
| 4,160,261 | 7/1979 | Casey, Jr. et al. | 257/289 |
| 4,378,255 | 3/1983 | Holonyak, Jr. et al. | 257/96 |
| 4,379,005 | 4/1983 | Hovel et al. | 148/187 |
| 4,800,415 | 1/1989 | Simmons et al. | 257/194 |
| 4,835,581 | 5/1989 | Kuroda et al. | 257/105 |
| 4,905,059 | 2/1990 | Shur | 257/194 |
| 4,962,409 | 10/1990 | Solomon | 257/192 |
| 5,021,841 | 6/1991 | Leburton et al. | |
| 5,589,696 | 12/1996 | Baba | 257/104 |

FOREIGN PATENT DOCUMENTS

| | | | |
|---|---|---|---|
| 0256360 | 2/1988 | European Pat. Off. | |
| 2607630 | 6/1988 | France | 257/105 |
| 62-209864 | 9/1987 | Japan | |
| 63-188972 | 8/1988 | Japan | |

OTHER PUBLICATIONS

S. M. Sze, *Semiconductor Devices Physics and Technology*, John Wiley & Sons, New York (1985) p. 225.

*Primary Examiner*—J. Carroll
*Attorney, Agent, or Firm*—Young & Thompson

[57] ABSTRACT

The tunnel transistor of the present invention has either a junction structure wherein a degenerated first semiconductor having one conduction type, a non-degenerated second semiconductor and a degenerated third semiconductor having the reverse conduction type to that of the first semiconductor are connected on a substrate or a laminated layer structure comprising a degenerated first semiconductor having one conduction type, a non-degenerated second semiconductor and a degenerated third semiconductor of the reverse conduction type to that of the first semiconductor all laminated on a part of a substrate. The tunnel transistor further includes a fourth semiconductor layer formed on an exposed surface of the second semiconductor, having a forbidden band wider than that of the second semiconductor and containing an ionized impurity therein, a gate electrode formed on the fourth semiconductor layer, and a pair of electrodes individually forming ohmic junctions to the first and third semiconductors. Due to the construction, even when the gate voltage is 0, electrons or positive holes are induced in the surface of the second semiconductor, and a tunnel current can be flowed between the source and the drain. Since control of the tunnel current can then be preformed by applying a reverse bias voltage between the gate and the drain, the leak current of the gate can be suppressed.

12 Claims, 5 Drawing Sheets

TUNNEL TRANSISTOR AND METHOD OF MANUFACTURING SAME

This application is a continuation of application Ser. No. 07/992,738, filed Dec. 18, 1992, now abandoned.

BACKGROUND OF THE INVENTION

1. Field of the Invention

This invention relates to a transistor of the type which makes use of the tunnel effect and allows high integration and high speed operation and to a method of manufacturing the transistor.

2. Description of the Related Art

A tunnel transistor has been proposed as a transistor which makes use of the tunnel phenomenon at the p+-n+ junction on the surface of a semiconductor and operates in accordance with a principle of operation different from that of an ordinary SiMOSFET or GaAsMESFET. FIGS. 1 and 2 show conventional examples of the tunnel transistor proposed by the inventor of the present invention and disclosed in Japanese Patent Laid-Open Applications No. 96766/83 and No. 277680/92, respectively.

The conventional example of the transistor shown in FIG. 1 includes a junction structure wherein substrate 1, degenerated first semiconductor 2 having a first conduction type and formed on substrate 1, non-degenerated second semiconductor 3, and third degenerated conductor 4 having a conduction type reverse to the conduction type of first semiconductor 2 are connected to each other. The transistor further includes insulating layer 5 made of a material having a forbidden band wider than that of second semiconductor 3 and formed on an exposed surface of second semiconductor 3 in an intermediate area between first and third semiconductors 2 and 4, gate electrode 6 formed on insulating layer 5, source electrode 7 joined to first semiconductor 2 to form an ohmic junction, and drain electrode 8 joined to third semiconductor 4 to form another ohmic junction.

Operation of the conventional tunnel transistor is described subsequently by way of an example wherein a GaAs substrate is employed for substrate 1, n+-GaAs for first semiconductor 2, thin i-GaAs for second semiconductor 3, p+-GaAs for third semiconductor 4, i-Al$_{0.5}$Ga$_{0.5}$As for insulator layer 5, Al for gate electrode 6, and Au for source electrode 7 and drain electrode 8. If the ground potential is applied to source electrode 7 and a negative voltage is applied to drain electrode 8 without applying a voltage to gate electrode 6, then a reverse bias is applied between first semiconductor (n+-GaAs) 2 and third semiconductor (p+-GaAs) 4 by way of second semiconductor (i-GaAs) 3. Consequently, no drain current flows. In this instance, a depletion layer extends along the i-GaAs layer of second semiconductor 3. If a high positive voltage is applied to gate electrode 6, then the potential at the surface of second semiconductor 3 which contacts with insulating layer 5 drops and electrons of a high concentration are induced there. As a result, the surface of the second semiconductor is a degenerated wherein the electron concentration is very high, and makes an equivalent n+-GaAs. Consequently, a completely conducting state is established between first semiconductor 2 and the surface of second semiconductor 3. Meanwhile, a junction similar to that of an Esaki diode (tunnel diode) is formed between the surface of second semiconductor 3 and third semiconductor 4. Accordingly, a high tunnel current due to the tunnel effect flows between the drain and the source between which the reverse bias is applied. Since the magnitude of the tunnel current depends upon the concentration of electrons induced in second semiconductor 3, the drain current is controlled by the voltage applied to gate electrode 6, and consequently, transistor operation is obtained.

The second conventional example of the transistor shown in FIG. 2 operates similarly to the first conventional transistor of FIG. 1 described above except that it has a laminated layer structure different from the junction structure of the conventional transistor of FIG. 1, including first semiconductor layer 2 formed on substrate 1, and second and third semiconductors 3 and 4 formed on first semiconductor layer 2, each having the shape of a mesa.

While the conventional tunnel transistors allow a high degree of IC integration, they have a drawback in that, when the structure of the present invention is realized using a compound semiconductor material as described here, a large gate leak current flows since a forward bias is applied between the source and the gate. It is desired to suppress the gate leak current in order to further reduce the power dissipation and raise the degree of integration.

SUMMARY OF THE INVENTION

It is an object of the present invention to provide a tunnel transistor which has a low power dissipation characteristic by suppressing the gate leak current and a method of manufacturing the tunnel transistor to achieve a very highly integrated circuit having low power dissipation.

According to one aspect of the present invention, there is provided a tunnel transistor, which comprises a junction structure formed on a substrate, comprising a non-degenerated second semiconductor, a degenerated first semiconductor of one conduction type formed at one part of the non-degenerated second semiconductor and a degenerated third semiconductor of the reverse conduction type to that of the first semiconductor at another part of the non-degenerated second semiconductor, the first, second and third semiconductors being connected in the direction of the plane of the substrate, a fourth semiconductor formed on an exposed surface of the second semiconductor in an intermediate area between the first semiconductor and the third semiconductor and having a forbidden band wider than that of the second semiconductor, the fourth semiconductor containing an ionized impurity therein, a gate electrode formed on the fourth semiconductor, and a pair of electrodes individually forming ohmic junctions to the first and third semiconductors.

According to another aspect of the present invention, there is provided a tunnel transistor, which comprises a laminated layer structure comprising a degenerated first semiconductor of one conduction type formed at one part of a substrate, a non-degenerated second semiconductor and a degenerated third semiconductor of the reverse conduction type to that of the first semiconductor, the first, second and third semiconductors being laminated in this order on the substrate, the portion of the laminated layer structure of the second and third semiconductors being formed in the shape of a mesa, a fourth semiconductor formed on an exposed surface of the second semiconductor on a side face of the mesa shape, the fourth semiconductor having a forbidden band wider than that of the second semiconductor and containing an ionized impurity therein, a gate electrode formed on the fourth semiconductor, and a pair of electrodes individually forming ohmic junctions to the first and third semiconductors.

In the tunnel transistors described above, an insulating layer may be formed intermediately between the fourth semiconductor and the gate electrode so that the withstand voltage property of the gate electrode may be enhanced to widen the range of the gate voltage to be applied.

According to a further aspect of the present invention, there is provided one method of manufacturing a tunnel transistor, which comprises the steps of forming a non-degenerated second semiconductor layer on a substrate and forming a fourth semiconductor layer, which has a forbidden band wider than that of the second semiconductor and contains an ionized impurity therein, on a part of the second semiconductor layer using the molecular beam epitaxy method, forming a gate electrode on the fourth semiconductor layer, performing ion implantation into the source area of the second semiconductor layer to form a degenerated first semiconductor of one conduction type and further performing ion implantation into the drain area of the second semiconductor to form a degenerated third semiconductor of the reverse conduction type to that of the first semiconductor, and finally forming a source electrode and a drain electrode in the source and drain areas, respectively.

According to a still further aspect of the present invention, there is provided another method of manufacturing a tunnel transistor, which comprises the steps of laminating a degenerated first semiconductor of one conduction type, a non-degenerated second semiconductor and a degenerated third semiconductor layer of the reverse conduction type to that of the first semiconductor successively on a substrate using the molecular beam epitaxy method to form a laminated layer structure, leaving a part of the laminated layer structure in the shape of a mesa by lithography and wet etching to expose a part of the second semiconductor layer on a side face of the mess shape, cleaning the work using an organic cleaning agent and forming a fourth semiconductor layer, which has a forbidden band wider than that of the second semiconductor and contains an ionized impurity therein, on the exposed surface of the second semiconductor layer on the side face of the mesa shape again using the molecular epitaxy method, forming a gate electrode on the fourth semiconductor layer, and finally forming a pair of electrodes individually having ohmic junctions on the first and third semiconductor layers by the lift-off method.

The method of manufacturing a tunnel transistor may additionally comprise the step of forming, prior to the step of forming the gate electrode, an insulating layer on the fourth semiconductor layer using the molecular beam epitaxy method so that the withstand voltage property of the gate electrode may be enhanced to widen the range of the gate voltage to be applied.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Several embodiments of the present invention are described in detail below with reference to the drawings.

First Embodiment

Figure 1:
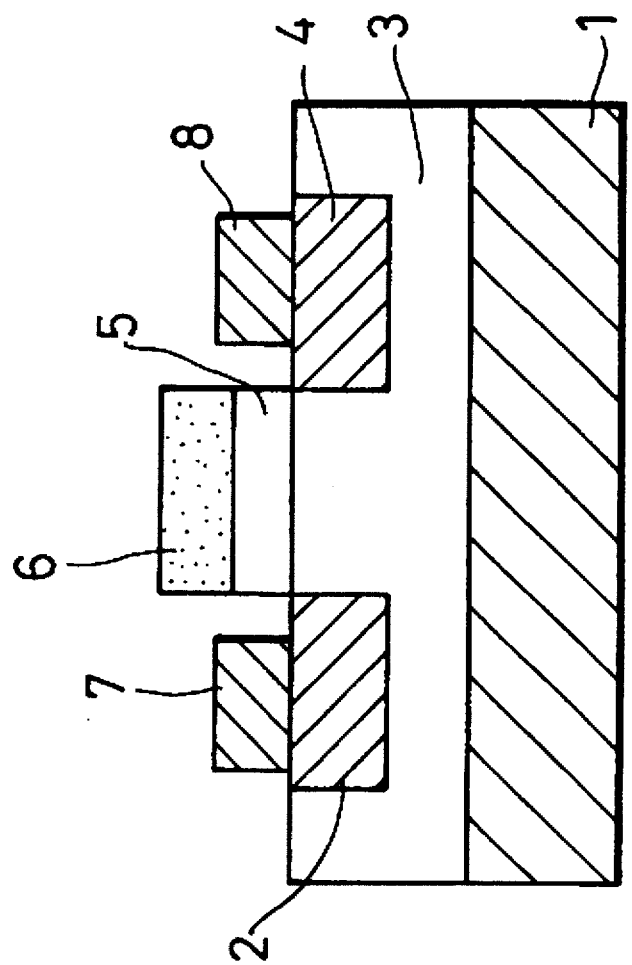
FIG. 1 is a schematic vie-showing the structure of a conventional example of a tunnel transistor.
Figure 3:
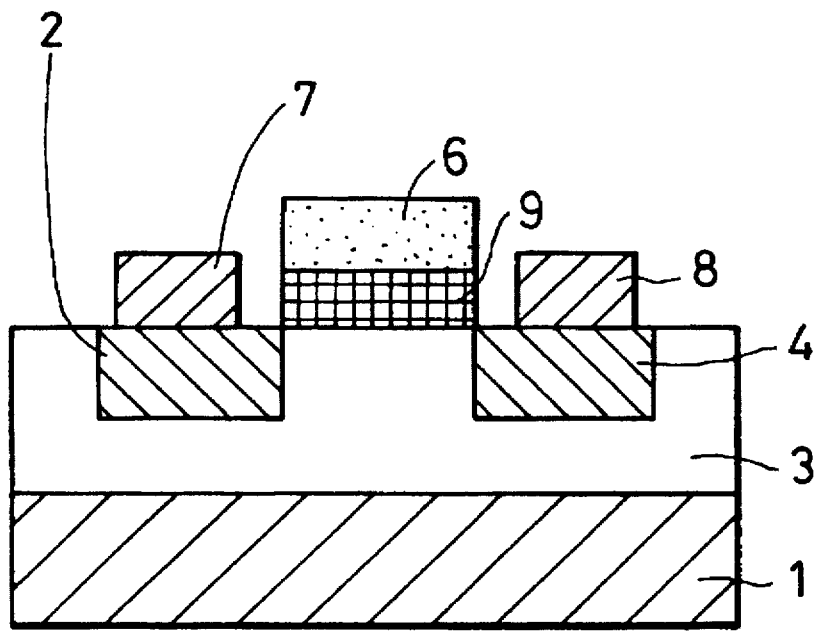
FIG. 3 is a schematic view showing the structure of a first embodiment of the tunnel transistor of the present invention.

Referring first to FIG. 3, the tunnel transistor shown includes, as in the conventional transistor shown in FIG. 1 and described above, a junction structure including substrate 1 for which a semi-insulating GaAs substrate is employed, first semiconductor 2 made of n+-GaAs and formed on substrate 1, second semiconductor 3 formed of a thin i-GaAs layer, and third semiconductor 4 made of p+-GaAs. The transistor further includes fourth semiconductor 9 formed on an exposed surface of second semiconductor 3 in an intermediate area between first and third semiconductors 2 and 4 and containing an n-type ionized impurity added to it, gate electrode 6 of Al formed on fourth semiconductor 9, and source electrode 7 and drain electrode 8 both made of Au and formed on first and third semiconductors 2 and 4, respectively.

Operation of the present embodiment is described.

In the present embodiment, since an n-type ionized impurity is added to fourth semiconductor 9, the heterojunction between fourth and second semiconductors 9 and 3 has a modulated dope structure and electrons are accumulated in the interface of second semiconductor 3 where the conduction band energy is low. Consequently, an equivalent thin p+-n+ tunnel diode structure is formed between the source and the drain, and even if no gate voltage is applied, if a voltage is applied between the source and the drain, then a tunnel current (drain current) flows. The concentration of electrons accumulated in the interface can be reduced by applying a negative voltage to the gate, and modulation of the drain current, i.e., transistor operation, is permitted. In this instance, since a high positive voltage need not be applied to the gate as in the conventional tunnel transistor, the leak current of the gate can be reduced significantly.

Subsequently, the method of manufacturing a tunnel transistor of FIG. 3 is described.

First, i-GaAs (second semiconductor 3) 500 nm thick is formed on a semi-insulating GaAs substrate, and then fourth semiconductor 9 of n-$Al_{0.3}Ga_{0.7}As$ (Si=$1\times10^{18}$ $cm^{-3}$) of 50 nm thick is formed by the MBE (molecular beam epitaxy) method. Then, after Al gate electrode 6 is formed, Se of a high concentration is ion implanted into the source area to form degenerated n+-GaAs (Se=N $2\times10^{19}$ $cm^{-3}$). Further, Be of a high concentration is ion implanted into the drain area to form degenerated p+-GaAs (Be=$5\times10^{19}$ $cm^{-3}$). Finally, source and drain electrodes 7 and 8 are formed by deposition of Au. The device was compared with a conventional device. The comparison revealed that the leak current density of the gate when the voltage between the source and the drain was −1 V and the drain current density was 0.1 mA/$cm^2$ was about 2 A/$cm^2$ with the conventional device but was 1 μA/$cm^2$ with the device of the present invention, obtaining a reduction of approximately 6 orders of magnitude.

Second Embodiment

Figure 4:
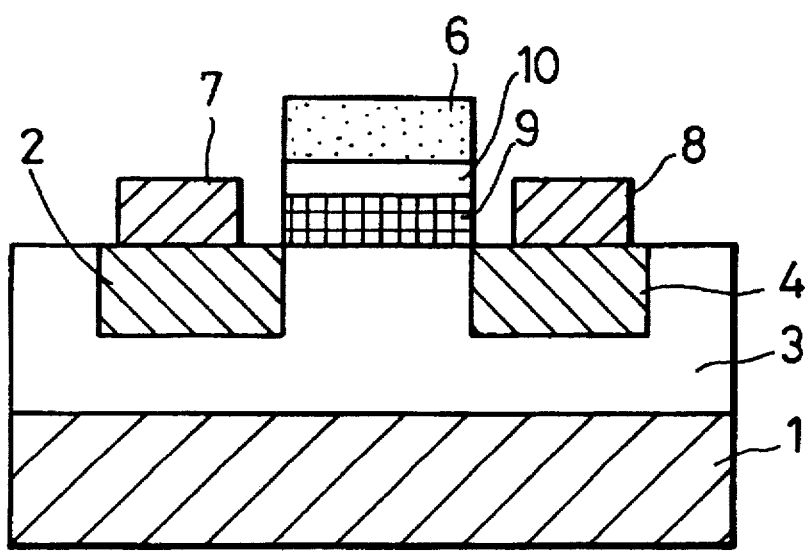
FIG. 4 is a schematic view showing the structure of a second embodiment of the tunnel transistor of the present invention.

FIG. 4 is a schematic view showing a second embodiment of the present invention. Components in FIG. 4 denoted by the same reference numerals as those of FIG. 3 are equivalent to those of FIG. 3 and have the same functions. Further, insulating layer 10 is interposed between fourth semiconductor layer 9 and gate electrode 6. As shown in FIGS. 3 and 4, the fourth semiconductor is contiguous with the first and third semiconductors. The following description is given employing i-$Al_{0.5}Ga_{0.5}As$ for insulator layer 10 and employing the same materials for the other components as those employed in the first embodiment.

The principle of operation of the present embodiment is almost the same as that of the first embodiment, and the gate leak current when the transistor operates can be suppressed. In the present embodiment, since i-$Al_{0.5}Ga_{0.5}As$ insulator layer 10 is interposed between fourth semiconductor 9 and gate electrode 6, the gate leak current is further suppressed compared with that of the first embodiment and the withstand voltage property against the gate voltage is enhanced. Accordingly, the range of voltage application can be increased.

Using the same manufacturing method and the same materials as those of the first embodiment, the tunnel transistor of FIG. 4 which has a structure wherein n-$Al_{0.3}Ga_{0.7}As$ (Si=$2\times10^{18}$ cm$^{-3}$, 20 nm) and i-$Al_{0.5}Ga_{0.5}As$ (30 nm) are formed as fourth semiconductor 9 and insulator layer 10, respectively, was produced. The tunnel transistor proved that little gate current flows and that the range of the applicable gate voltage was increased by approximately 1 V.

Third Embodiment

Figure 2:
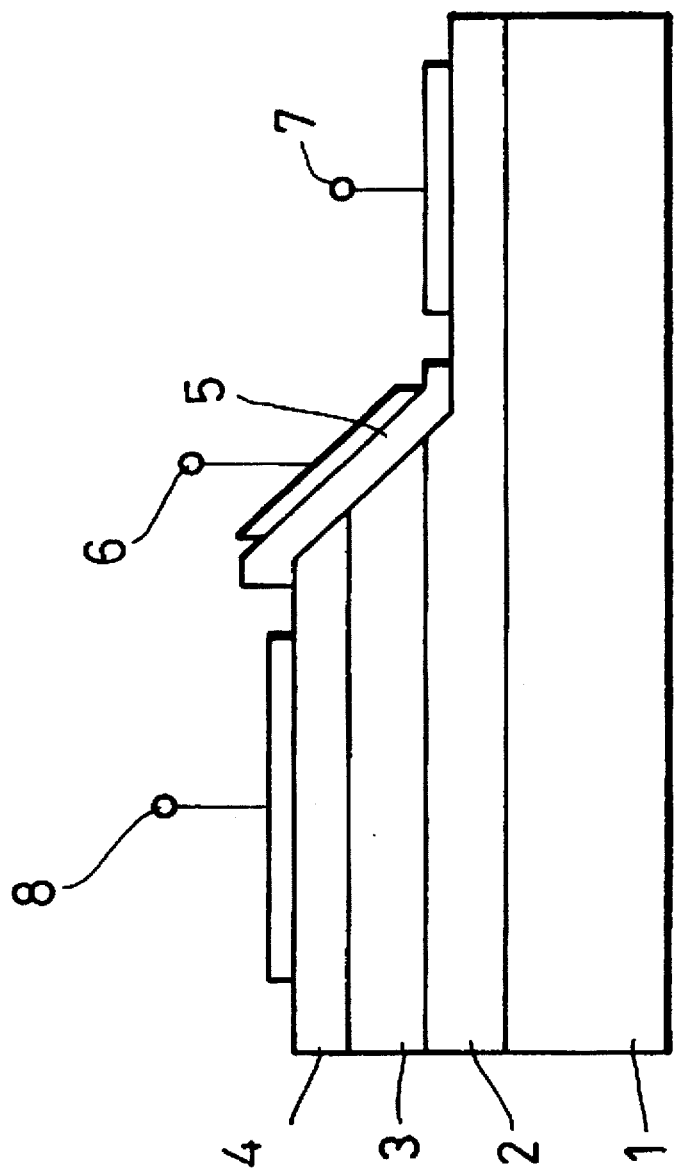
FIG. 2 is a schematic view showing the structure of another conventional example of a tunnel transistor.
Figure 5:
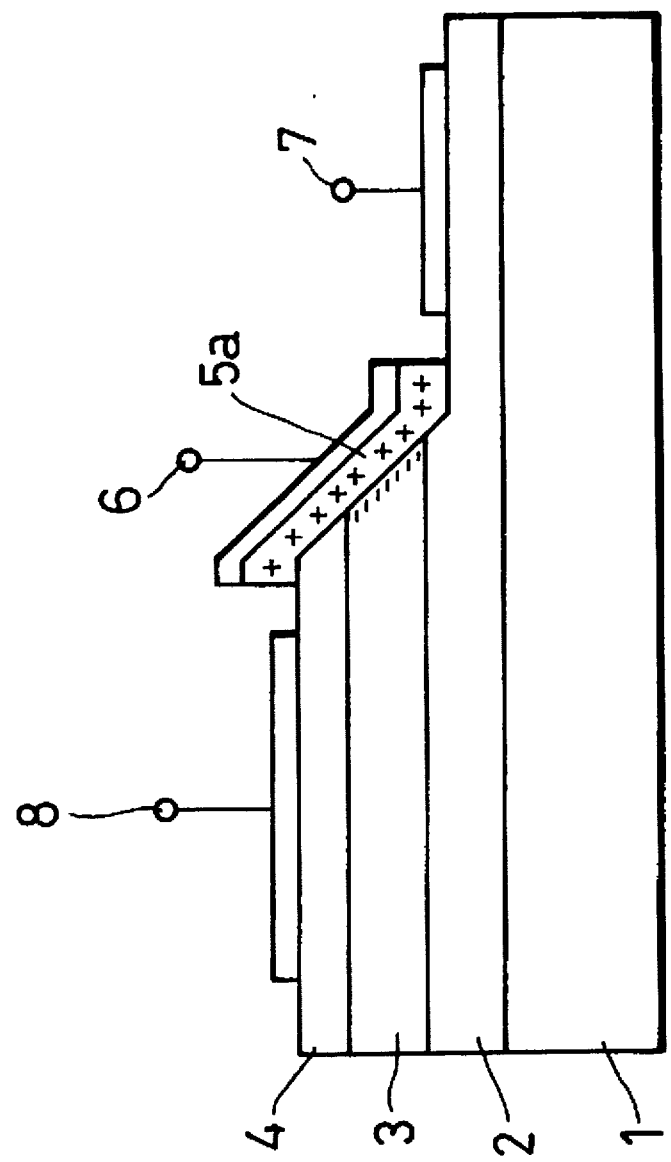
FIG. 5 is a schematic view showing the structure of a third embodiment of the tunnel transistor of the present invention.

FIG. 5 is a schematic view showing a third embodiment of the present invention. The tunnel transistor shown in FIG. 5 has, similar to the conventional transistor shown in FIG. 2 and described above, a laminated layer structure including substrate 1 made of a semi-insulating GaAs, first semiconductor 2 formed of an n+-GaAs layer on substrate 1, and second semiconductor 3 in the form of a thin i-GaAs layer and third semiconductor 4 in the form of a p+-GaAs layer remaining in the shape of a mesa on first semiconductor 2. The tunnel transistor further includes fourth semiconductor 5a formed at least on an exposed surface of the layer of second semiconductor 3 on the mesa-shaped side face and containing an n-type ionized impurity, and gate electrode 6 of Al formed on fourth semiconductor 5a. Further, drain electrode 8 of AuZn and source electrode 7 of AuGe are formed on mesa-shaped third semiconductor 4 and first semiconductor 2, respectively.

The present embodiment also has the same operation functions as those of the first embodiment described above and exhibits the same effects since an n-type ionized impurity is added to fourth semiconductor 5a.

Subsequently, the method of manufacturing the tunnel transistor of FIG. 5 is described.

First, first semiconductor 2 of n+-GaAs (Si=$1\times10^{19}$ cm$^{-3}$ 300 nm) second semiconductor 3 (200 nm) of i-GaAs and third semiconductor 4 of p+-GaAs (Be=$5\times10^{19}$ cm$^{-3}$, 100 nm) are laminated successively on substrate 1 of semi-insulating GaAs at a substrate temperature of 520° C. by the MBE method. Then, part of a side face of second semiconductor 3 of i-GaAs is exposed by lithography and wet etching leaving a drain area in the form of a mesa. Further, cleaning is performed using an organic cleaning agent, and then the work is again accommodated into the MBE equipment, in which fourth semiconductor 5a of n-$Al_{0.3}Ga_{0.7}As$ (Si=$2\times10^{18}$ cm$^{-3}$, 50 nm) is thereafter re-grown on the exposed mesa-formed side face of second semiconductor 3. Then, the work is taken out of the MBE equipment, and Al is deposited on fourth semiconductor 5a. Thereafter, fourth semiconductor 5a and Al are etched into the shape of gate electrode 6. Subsequently, AuGe is formed on first semiconductor 2 by the lift-off method to alloy it into source electrode 7. Finally, AuZn is formed on third semiconductor 4 by the lift-off method to form drain electrode 8, thereby completing the manufacture of the tunnel transistor structure.

Fourth Embodiment

Figure 6:
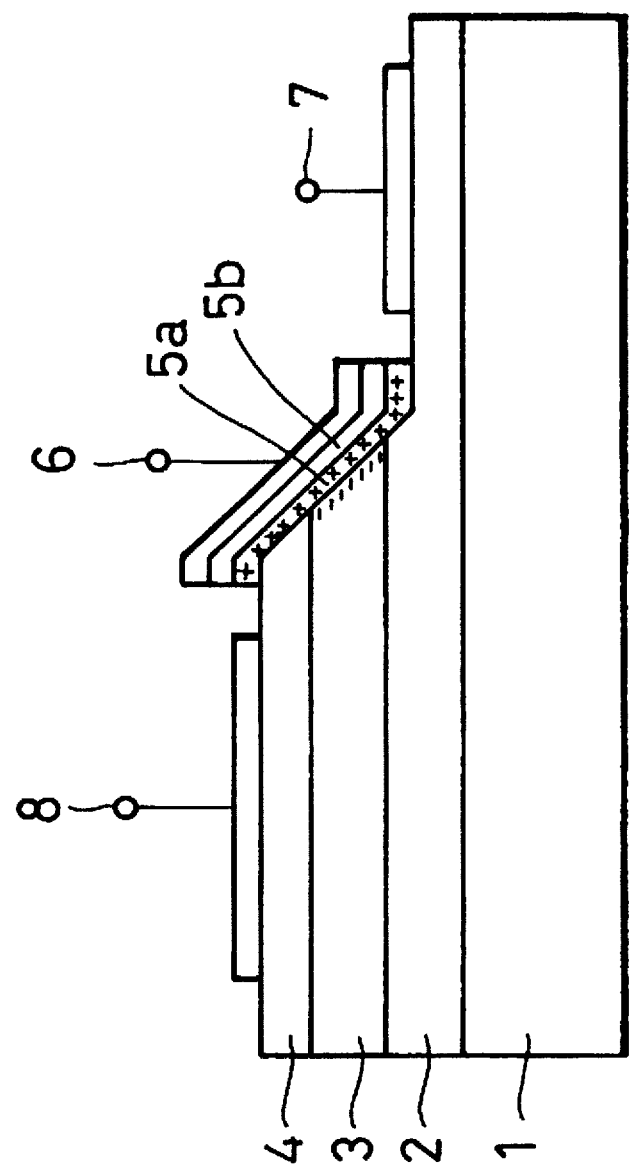
FIG. 6 is a schematic view showing the structure of a fourth embodiment of the tunnel transistor of the present invention.

FIG. 6 is a schematic view showing a fourth embodiment of the present invention. Components in FIG. 6 denoted by the same reference numerals as those of FIG. 5 are equivalent to those of FIG. 5 and have the same functions. Further, the present embodiment is similar to the third embodiment described above except that insulator layer 5b is interposed between fourth semiconductor layer 5a and gate electrode 6 and that n-$Al_{0.3}Ga_{0.7}As$ ($1\times10^{19}$ cm$^{-3}$) is employed for fourth semiconductor layer 5a while i-$Al_{0.6}Ga_{0.4}As$ (40 nm) is employed for insulator layer 5b. As shown in FIGS. 5 and 6, the fourth semiconductor is contiguous with the first and third semiconductors.

Also in the present embodiment, the principle of operation is the same as that of the third embodiment described above due to the presence of fourth semiconductor layer 5a containing an n-type ionized impurity therein as well as insulator layer 10. The range of the applicable gate voltage was improved from −0.6 V to −2.0 V.

While the gate electrode in the embodiments of the present invention described above constitutes a Schottky electrode, it may also constitute some other electrode. Further, while the first and fourth semiconductors are described as being of the n conduction type and the third semiconductor is described as being of the p conduction type, the same effects can be achieved even if the conduction types are reversed. Further, it is apparent that the present invention can use, as materials, not only GaAs/AlGaAs type materials but also any combination of other semiconductors such as Ge/SiGe, SiGe/Si, Si/GaP, Ge/GaAs, InGaAs/InAlAs, GaSb/AlGaSb and InAs/AlGaSb.

Although certain preferred embodiments of the present invention have been shown and described in detail, it should be understood that various changes and modifications may be made therein without departing from the scope of the appended claims.

What is claimed is:

1. A tunnel transistor, comprising a junction structure formed on a substrate having a surface disposed in a plane, comprising a non-degenerated second semiconductor disposed on said surface, a degenerated first semiconductor of one conduction type formed at one part of said non-degenerated second semiconductor and a degenerated third semiconductor of a reverse conduction type to that of said first semiconductor at another part of said non-degenerated second semiconductor, said first, second and third semiconductors being connected in a direction parallel to said plane; a fourth semiconductor formed on an exposed surface of said second semiconductor in an intermediate area between said first semiconductor and said third semiconductor and having a forbidden band wider than that of said second semiconductor, said fourth semiconductor being contiguous with said first and third semiconductors, said fourth semiconductor containing an ionized impurity therein of a same conduction type as said first semiconductor to form a modulation doping structure with said second semiconductor so that a conducting channel is produced in an interface of said second semiconductor whereby a tunnel junction is formed with said first and third semiconductors; an insulating layer formed on said fourth semiconductor; a gate electrode formed on said insulating layer; and a pair of electrodes individually forming ohmic junctions to said first and third semiconductors.

2. A tunnel transistor as claimed in claim 1, wherein said substrate is an undoped semiconductor material.

3. A tunnel transistor as claimed in claim 2, wherein said substrate is semi-insulating GaAs.

4. The tunnel transistor of claim 1, wherein said tunnel junction is present without application of a positive voltage at said gate electrode.

5. In a tunnel transistor, comprising a laminated layer structure which comprises a degenerated first semiconductor of one conduction type formed on a substrate, a non-degenerated second semiconductor overlying said first semiconductor and a degenerated third semiconductor of a reverse conduction type to that of said first semiconductor, said third semiconductor overlying said second semiconductor, a portion of said second and third semiconductors being formed in the shape of a mesa; the improvement comprising a fourth semiconductor formed on an exposed surface of said second semiconductor on a side face of the mesa shape, said fourth semiconductor being contiguous with said first and third semiconductors, the fourth semiconductor having a forbidden band wider than that of said second semiconductor and containing an ionized impurity therein of a same conduction type as said first semiconductor to form a modulation doping structure with said second semiconductor so that a conducting channel is produced in an interface of said second semiconductor whereby a tunnel junction is formed with said first and third semiconductors; a gate electrode formed on said fourth semiconductor; and a pair of electrodes individually forming ohmic junctions to said first and third semiconductors.

6. A tunnel transistor as claimed in claim 5, wherein an insulating layer is formed intermediate between said fourth semiconductor and said gate electrode.

7. A tunnel transistor as claimed in claim 5, wherein said gate electrode is a Schottky electrode.

8. A tunnel transistor as claimed in claim 5, wherein said substrate is an undoped semiconductor material.

9. A tunnel transistor as claimed in claim 8, wherein said substrate is semi-insulating GaAs.

10. The tunnel transistor of claim 5, wherein said tunnel junction is present without application of a positive voltage at said gate electrode.

11. A tunnel transistor, comprising a junction structure formed on a substrate having a surface disposed in a plane, comprising a non-degenerated second semiconductor disposed on said surface, a degenerated first semiconductor of one conduction type formed at one part of said non-degenerated second semiconductor and a degenerated third semiconductor of a reverse conduction type to that of said first semiconductor at another part of said non-degenerated second semiconductor, said first, second and third semiconductors being connected in a direction parallel to said plane; a fourth semiconductor formed on an exposed surface of said second semiconductor in an intermediate area between said first semiconductor and said third semiconductor and having a forbidden band wider than that of said second semiconductor, said fourth semiconductor being contiguous with said first and third semiconductors, said fourth semiconductor containing an ionized impurity therein of a same conduction type as said first semiconductor to form a modulation doping structure with said second semiconductor so that a conducting channel is produced in an interface of said second semiconductor whereby a tunnel junction is formed with said first and third semiconductors; a gate Schottky electrode formed on said fourth semiconductor; and a pair of electrodes individually forming ohmic junctions to said first and third semiconductors.

12. A tunnel transistor, comprising a junction structure formed on a substrate having a surface disposed in a plane, comprising a non-degenerated second semiconductor disposed on said surface, a degenerated first semiconductor of a negative conduction type formed at one part of said non-degenerated second semiconductor and a degenerated third semiconductor of a positive conduction type at another part of said non-degenerated second semiconductor, said first, second and third semiconductors being connected in a direction parallel to said plane; a fourth semiconductor formed on an exposed surface of said second semiconductor in an intermediate area between said first semiconductor and said third semiconductor and having a forbidden band wider than that of said second semiconductor, said fourth semiconductor being contiguous with said first and third semiconductors, said fourth semiconductor containing an ionized impurity therein of a negative conduction type to form a modulation doping structure with said second semiconductor so that a conducting channel is produced in an interface of said second semiconductor whereby a tunnel junction is formed with said first and third semiconductors; a gate electrode formed on said fourth semiconductor; and a pair of electrodes individually forming ohmic junctions to said first and third semiconductors; wherein said first semiconductor, said second semiconductor, said third semiconductor and said fourth semiconductor are formed of degenerated $n^+$-GaAs, a non-degenerated i-GaAs layer, degenerated $p^+$-GaAs and an n-AlGaAs layer, respectively.

* * * * *